(12) United States Patent
Sandefer

(10) Patent No.: US 9,775,258 B1
(45) Date of Patent: Sep. 26, 2017

(54) CABLE MANAGEMENT CONTAINER

(71) Applicant: Jerry Sandefer, Portland, OR (US)

(72) Inventor: Jerry Sandefer, Portland, OR (US)

( * ) Notice: Subject to any disclaimer, the term of this patent is extended or adjusted under 35 U.S.C. 154(b) by 0 days.

(21) Appl. No.: 15/294,496

(22) Filed: Oct. 14, 2016

(51) Int. Cl.
*H05K 5/02* (2006.01)
*H01R 25/00* (2006.01)

(52) U.S. Cl.
CPC ......... *H05K 5/0247* (2013.01); *H01R 25/006* (2013.01); *H05K 5/0221* (2013.01)

(58) Field of Classification Search
CPC ... H05K 5/0247; H05K 5/0221; H01R 25/006
USPC ...... 174/541, 542; 312/317.1; 361/641, 654, 361/679.22
See application file for complete search history.

(56) References Cited

U.S. PATENT DOCUMENTS

| | | | |
|---|---|---|---|
| 4,921,444 A | 5/1990 | Cama | |
| 4,984,982 A * | 1/1991 | Brownlie | G02B 6/4451 174/490 |
| 6,028,267 A * | 2/2000 | Byrne | H01R 13/518 174/55 |
| 8,746,606 B1 | 6/2014 | Murray | |
| 9,565,928 B2 * | 2/2017 | Kassanoff | A47B 17/04 |
| 2005/0268823 A1 * | 12/2005 | Bakker | A47B 21/06 108/50.02 |
| 2008/0200050 A1 * | 8/2008 | Byrne | H02G 3/185 439/131 |
| 2008/0303394 A1 * | 12/2008 | Woods | A47B 96/00 312/317.1 |
| 2009/0142947 A1 * | 6/2009 | Byrne | G06F 1/266 439/131 |
| 2010/0090491 A1 * | 4/2010 | Hipshier | B60R 7/04 296/24.34 |
| 2011/0147542 A1 | 6/2011 | Hoek | |
| 2012/0200989 A1 * | 8/2012 | Byrne | H01R 35/04 361/641 |

* cited by examiner

*Primary Examiner* — Timothy Thompson
*Assistant Examiner* — Michael F McAllister
(74) *Attorney, Agent, or Firm* — Mohr Intellectual Property Law Solutions, PC

(57) ABSTRACT

The cable management container includes a breadbox-like container with a lid that follows the contours of the container. The container includes a front wall, rear wall, side walls, a bottom wall, a top wall, and a sleeve. The top wall also functions as the lid. The bottom wall supports a receptacle array. The receptacle array includes a plurality of power outlets into which multiple electrical plugs may be organized and plugged into connection with an external power source. The container further includes at least one aperture on one of the sides of the container through which electrical cords may be threaded as well as an external power cord.

8 Claims, 8 Drawing Sheets

CABLE MANAGEMENT CONTAINER

BACKGROUND

The present disclosure relates generally to multi-receptacle cable-management containers. In particular, multi-receptacle cable-management containers that enclose multiple individual AC receptacles and a plurality of power cords and cables within a roll-top enclosure are described.

For convenience, the terms cable and cord will be used interchangeably herein to reference power cables and/or power cords. Power cords will be described most often as one example of a cord or cable managed by the disclosed containers. However, the concepts discussed herein are applicable to power cords, power cables, data cords, data cables, audiovisual cords, and audiovisual cables.

Known cable-management containers are not entirely satisfactory for the range of applications in which they are employed. For example, existing containers do not completely hide from view the many power cables that are plugged into an AC power strip or wall outlet nor do they provide a built-in mechanism for gathering or tying together these power cords. In addition, conventional containers typically do not feature a way to channel these power cords through a conduit or raceway and do not prevent young children from accessing the plugged in power cords.

Further, known cable-management containers are often cumbersome. To the limited extent that such containers attempt to hide away cords and cables, they include awkward mechanisms for accessing the power cords. Conventional cable-management containers do not employ an enclosure configured to retract within a sleeve. Further, known containers do not include cable deflectors or ramps to help feed cables inside of an enclosure.

Existing cable-management containers or specialized audio/video furniture are not compact or easy to use and generally contain no means for adequate ventilation. Further, conventional cable-management containers are not cosmetically or aesthetically pleasing, which is important for home and office environments where power-cord management is needed.

Thus, there exists a need for multi-receptacle cable-management containers that improve upon and advance the design of known cable-management containers. The following three patent references are exemplary of the types of cable and cord organizers currently known and are incorporated by reference herein for all purposes: U.S. Pat. No. 8,746,606 to Murray filed May 17, 2011 ("Murray"), U.S. Pat. No. 4,921,444 to Camas filed Oct. 12, 1988 ("Camas"), and U.S. Patent Application 20110147542 to Hoek filed Dec. 21, 2010 ("Hoek").

The Murray reference discloses an electrical cord organization box. The electrical cord organization box in Murray is a box with a lid. Inside the box are an array of helical cones onto which cords may be wound and unwound. The electrical cord organizer box in Murray also includes slots on its front and rear surface to accept electrical cables before and after being wound around the helical cone. While Murray's electrical cord organization box organizes excess lengths of cable, it does not allow a user to organize a large number of plugs that have to go into an outlet.

The Camas reference discloses an electric plug organizer that includes a holder which surrounds the periphery of an electric plug for retaining the plug in a storage position. The electric plug organizer only has the capacity for two plugs and holds the plugs when the plugs are not plugged into the electrical outlet. Thus, the electric plug organizer in Camas does not does not work well for organizing a larger number of plugs nor is it the aim of the Camas electric plug organizer to organize electrical plugs when they are plugged into an electrical outlet.

The Hoek reference discloses a cable organizing system. This cable organizer system is a holder that includes slots through which cables may be inserted or threaded through. The cable organizing system in Hoek is open and thus does not protect the components from small children nor does it conceal the plethora of cables it organizes. Furthermore, the cable organizing system in Hoek does not contain any power outlets and thus, a user must supply his own power strip leading to disorganized and an unattractive jumble of cables near the power strip or strips.

SUMMARY

The present disclosure is directed to a cable management container includes a front and rear wall, side walls, a rear wall, a bottom wall, and a top wall. The top wall also functions as a lid that moves slidingly to allow access into the container. The bottom wall supports a receptacle array. The receptacle array includes a plurality of power outlets into which multiple electrical plugs may be organized and plugged into connection with an external power source. The containers further include at least one aperture on one of the sides of the container through which electrical cords may be threaded as well as an external power cord. In some examples, the top wall slides above a sleeve, or under a sleeve. In other examples, the top wall slides into the sleeve when opened, concealing the top wall.

DETAILED DESCRIPTION

Figure 1:
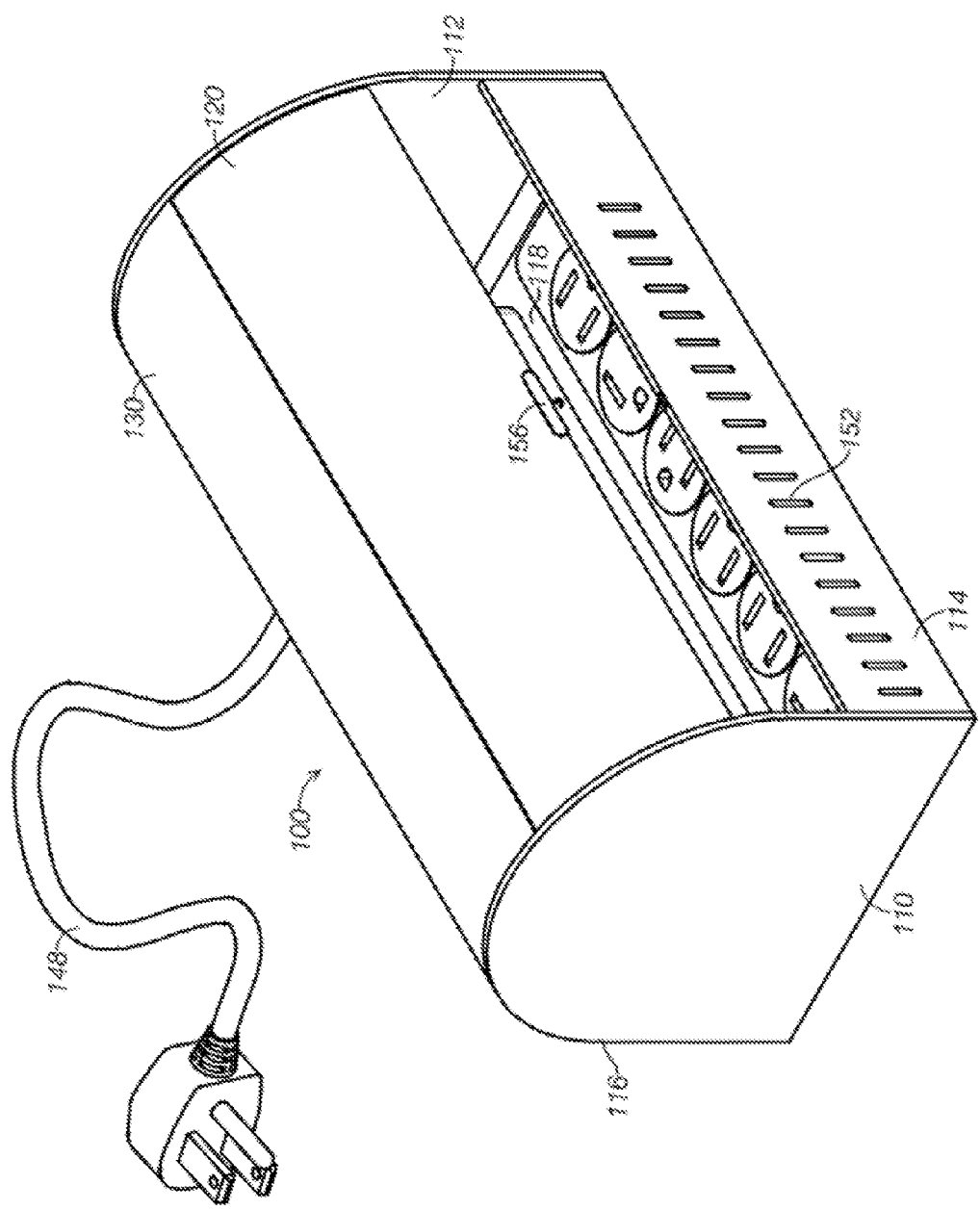
FIG. 1 is a perspective view of a first example of a cable-management container.

The disclosed multi-receptacle cable-management containers will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, a variety of multi-receptacle cable-management container examples are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

The present disclosure is directed to a container for organizing and concealing electrical cables with an enclosure. The cable organizer has a front, a rear, a bottom and side surfaces. The rear surface includes at least one opening through which electrical cables would be threaded. Within the interior space 122, a receptacle array is supported by a bottom surface. The receptacle array contains at least one power outlet but also may contain arrays of power outlets. The cable organizer further includes a cable deflector that directs the cables to the power outlets once they are threaded through the opening on the rear surface.

FIGS. 1-5 show a first embodiment of the invention. With reference to FIG. 1-5, a cable management container 100 is shown and functions to enclose a plurality of power cords that terminate at an internal array of outlets. The top wall of cable management container 100 may be in an open or closed position. Thus, multi-receptacle cable-management container 100 selectively keeps from view the unsightly power cords and allows for the cords to connect to an AC power source the internal outlets.

Cable-management container 100 is cosmetically and aesthetically pleasing. An aesthetically pleasing design is important in applications like cable management because often the cables to be managed will be in home and office settings and the cable management container will be visible to people in those environments. Cable management container 100 would fit in well with the décor of many homes, offices, and commercial settings.

In operation, cable management container 100 is used to store a plurality of terminated ends of corresponding power cables. A user may route power cords inside multi-receptacle cable-management container 100 and plug them into the internal outlets. To conceal the power cords, the user may either collect and tie off excess lengths of cord within container 100 and/or selectively close container 100. However, when a user wishes to view or access the power cords, the user may selectively open container 100.

Referring still to FIGS. 1-5, cable management container 100 includes a first side wall 110, a second side wall 112, a front wall 114, a rear wall 116, a bottom wall 118, a top wall 120, and a sleeve 130. First side wall 110 faces second side wall 112 and is a given distance from each other. Rear wall 116 and front wall 114 extend between first side wall 110 and second side wall 112.

Bottom wall 118 extends between first side wall 110, second side wall 112, front wall 114 and rear wall 116. Top wall 120 and sleeve 130 extend between first side wall 110 and second side wall 112, such that top wall 120 and sleeve 130 together are configured to extend from rear wall 116 to front wall 114 providing a closed interior space 122 when top wall 120 is in contact with front wall 114, or allows user to access cables and plugs contained within cable management container 100 when front wall 114 is in the retracted position inside sleeve 130. Cable management container 100 shown in FIGS. 1-5 is in the shape of a breadbox but in other examples, cable management container 100 can take on any desired shape, including but not limited to a cube or boxed shape, spherical, hemispherical, triangular, or any other polygonal shape.

Figure 2:
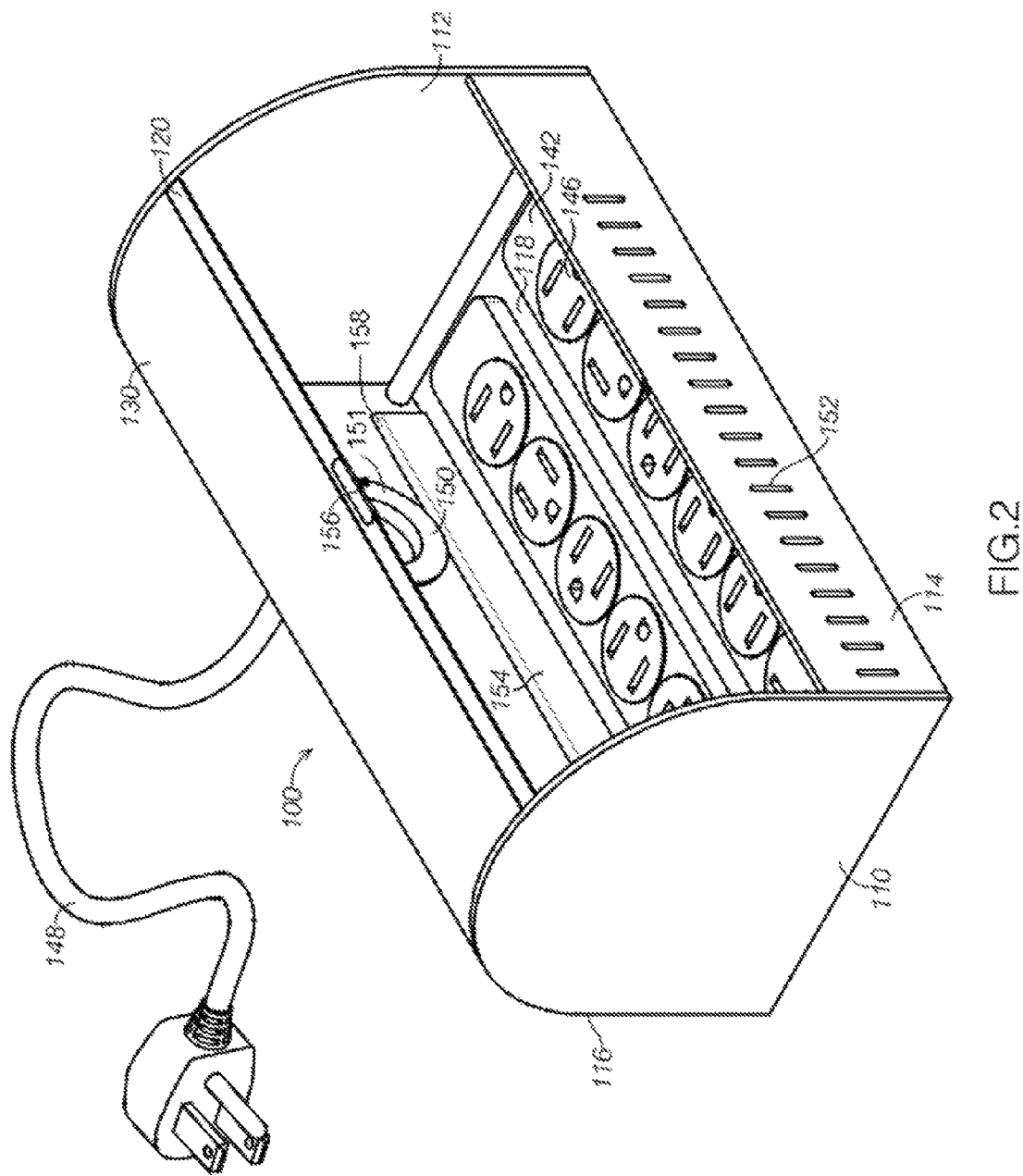
FIG. 2 is an alternate perspective view of the cable management container shown in FIG. 1 where the cover is retracted.
Figure 3:
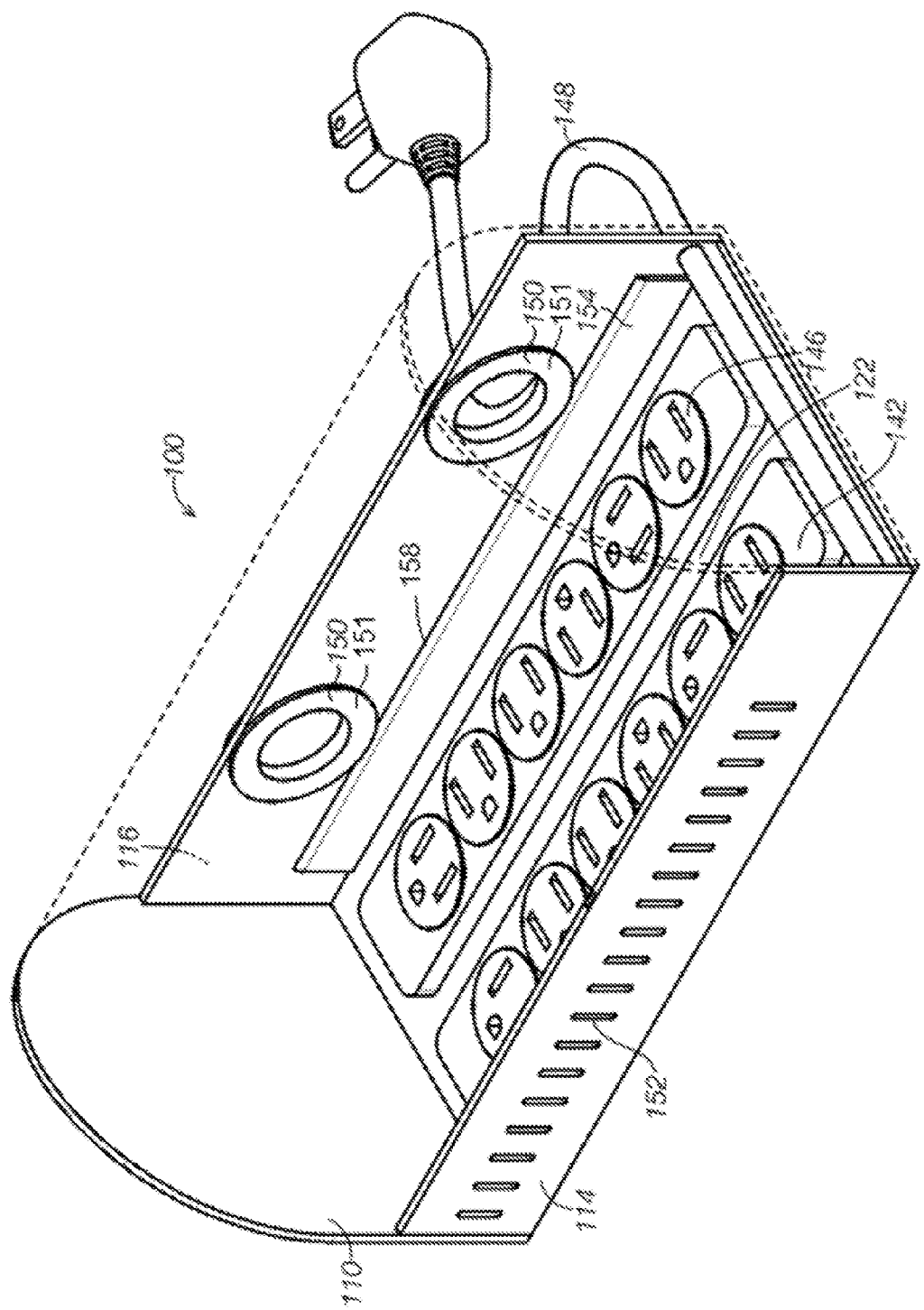
FIG. 3 is a perspective view of the container shown in FIG. 1 with the top depicted as transparent to show internal components including outlets, apertures, and a cable deflector.
Figure 4:
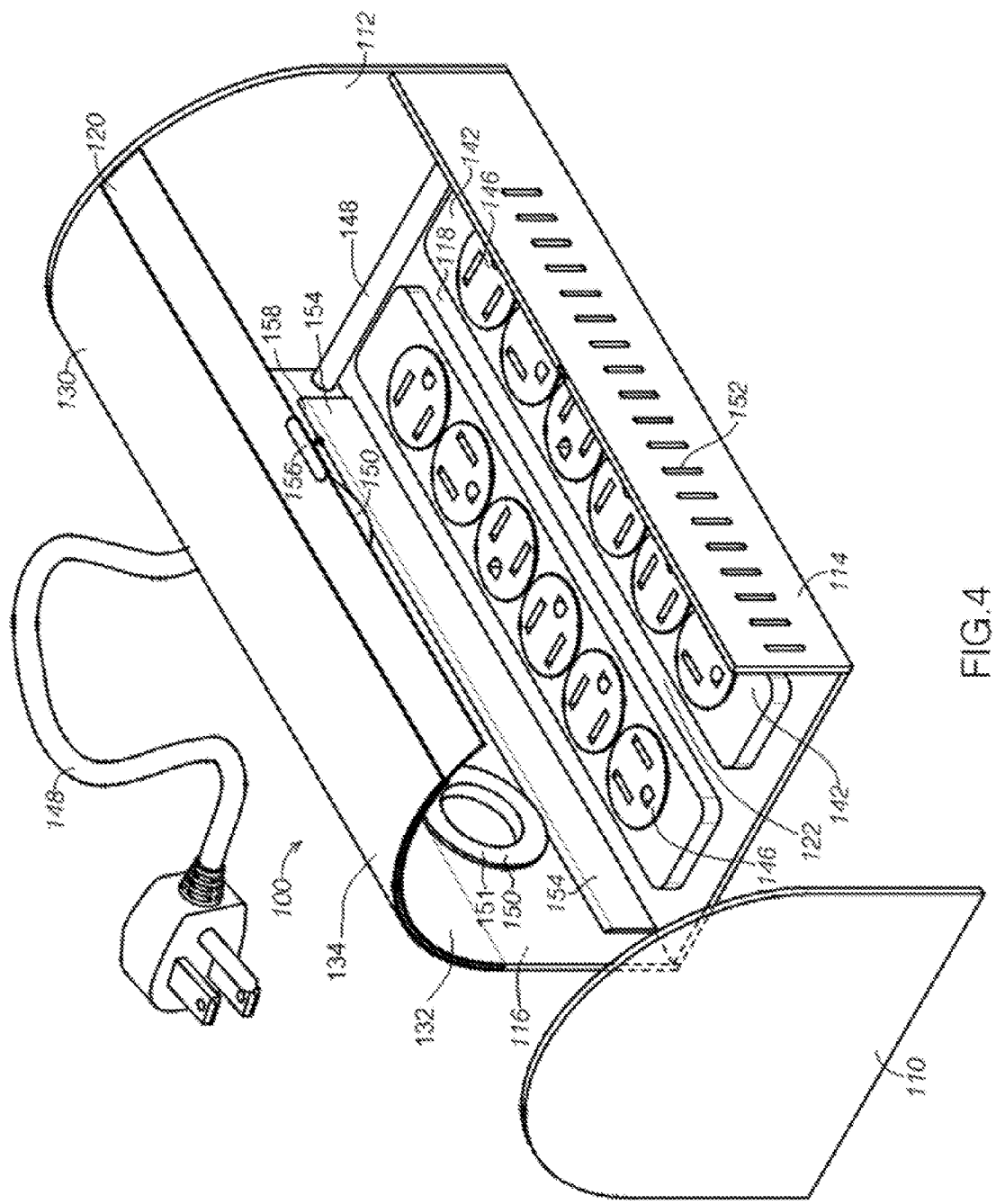
FIG. 4 is a perspective view of the container shown in FIG. 1 with one side wall removed to show a top cover sliding into a sleeve.
Figure 5:
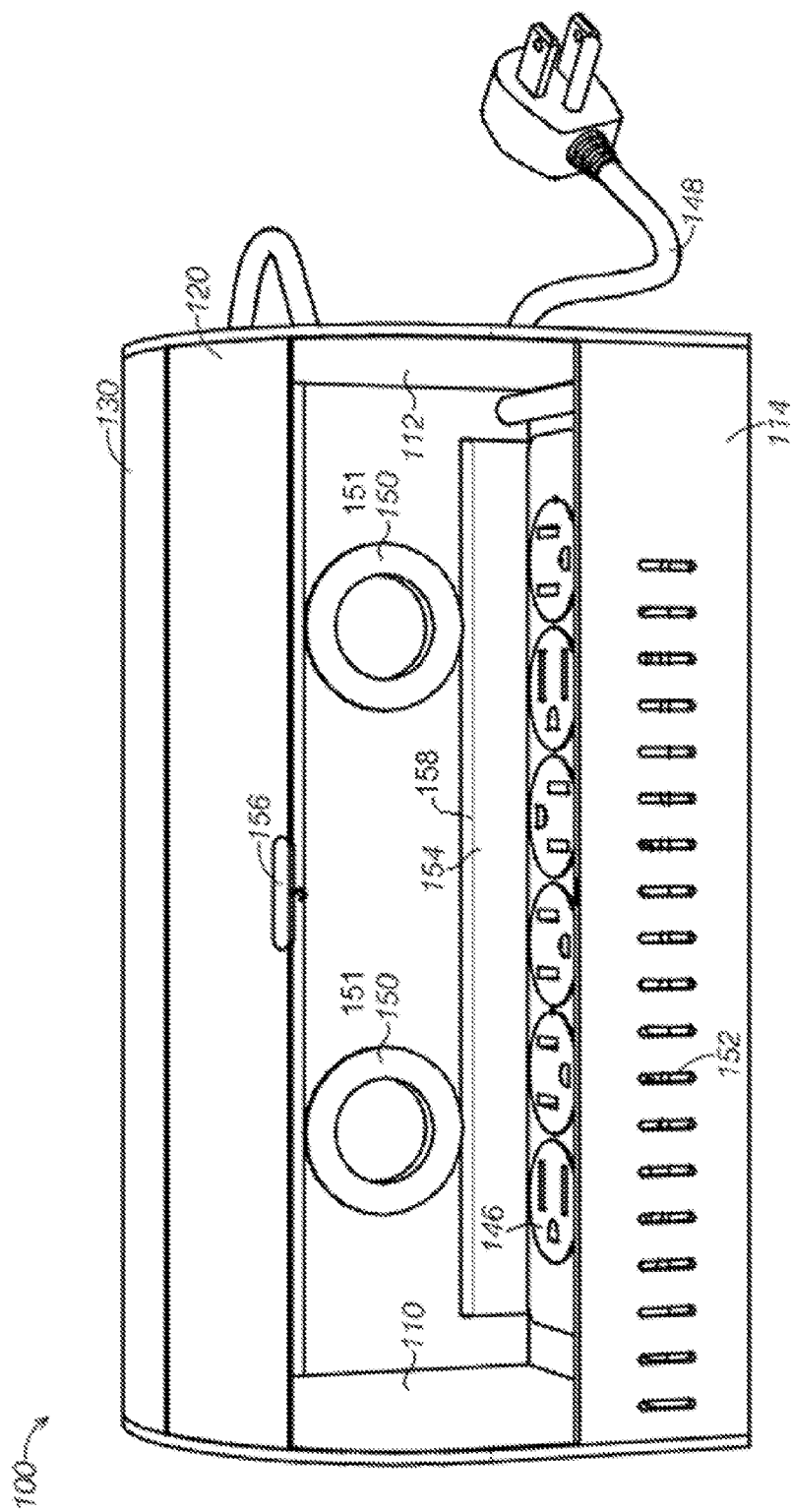
FIG. 5 is a front view of the container shown in FIG. 1.

FIGS. 1-5 also show that cable management container 100 includes top wall 120. Top wall 120 is horizontally disposed between first side wall 110 and second side wall 112 and is largely opaque in this embodiment. In alternative embodiment, top wall is transparent or translucent. Top wall 120 can be in an open position as shown in FIG. 2, a closed position, or some intermediate position as depicted in FIG. 1. Cable management container 100 also includes a sleeve 130 that is horizontally disposed between first side wall 110 and second side wall 112, and extends to rear wall 116. Sleeve 130 has a sleeve inner wall 132 and a sleeve outer wall 134 where sleeve inner wall 132 and sleeve outer wall 134 create a void or space between them. The space between sleeve inner wall 132 and sleeve outer wall 134 is sized such that it can receive top wall 120. When open, top wall 120 is in a retracted position inside sleeve 130, allowing user access to the interior space 122 of cable management container 100 for plugging in, unplugging and adjusting a plurality of cables and plugs contained within. When top wall 120 is closed, the power cord plugs contained within cable management container 100 are concealed from view.

Next, first side wall 110 and second side walls 112 face each other and are in connection with each other via rear wall 116, bottom wall 118, front wall 114, top wall 120, and sleeve 130. In the embodiment in FIGS. 1-5, first side wall 110 and second side wall 112 are in the shape of a bell arch. In those cases, the top wall of the cable organizer can be a roll top cover. Furthermore, the top wall 120 can retract into a sleeve 130. In this embodiment, the bell-shaped curve of first side wall 110 and second side wall 112 guide the side edges of first side wall 110 and second side wall 112 to move slidingly into sleeve 130.

In the present embodiment, two cable ports 150 are disposed on rear wall 116. Rear wall 116 extends longitudinally between first side wall 110 and second side wall 112. Rear wall 116 extends vertically upward from bottom wall 118. Rear wall 116 includes two cable ports 150 or apertures in which cables and plugs are inserted into the interior of cable management container 100. In other embodiments, the rear wall 116 contains one cable port 150. Still in other embodiments, the rear wall 116 contains more than two cable ports 150. Sill in alternative embodiments, cable ports 150 or apertures are located on walls other than a rear wall.

In this embodiment, cable ports 150 are circular holes in rear wall 116. Alternatively, cable port 150 may be in any shape or size that is able to receive a plurality of plugs through its aperture for accessing the interior of cable management container 100, including triangular, square, pentagonal, hexagonal, heptagonal, octagonal, and so forth. The aperture of cable port 150 may optionally be lined with a cushioning material to prevent abrasion of the cables against the edges of cable port 150. In the present embodiment, cable port 150 is lined with rubber grommets 151. In other embodiments, the cable ports can be lined with any cushioning material that prevents abrading the cables passing through, or not lined at all.

Front wall 114 extends vertically upward from bottom wall 118. The top edge of front wall 114 can meet with the bottom edge of top wall 120 when top wall 120 is in a down position. In some embodiments, the front wall may include a plurality of vents 152 that aid in circulating the outside ambient air, which is generally cooler in temperature, with warmer air inside cable management container. In this embodiment, the container vents 152 are vertical and evenly spaced along the longitudinal side of front wall 114. However, the container vents 152 may be placed in any number and manner and take on any desired shape and design. Vents 152 may also be disposed on other walls in alternative embodiments. There may also be no vents 152 on other alternative embodiments of the invention.

Next, bottom wall 118 extends between first wall 110, second wall 112, front wall 114, and rear wall 116. Bottom wall 118 supports at least one receptacle array 142 into which different plugs may be plugged. Receptacle array 142 interconnects outlets 146 with an electrical cord 148 which routes to an exterior wall outlet to deliver electrical power to outlets 146. Any conventional or later developed power cord may be used with any standard or later developed electrical interface, such as a two-pronged plug, a three-pronged plug, or a universal serial bus connector.

Cable deflector 154 is permanently or removably attached to rear wall 116 such that it is near cable port 150. Cable deflector 154 is used to direct plugs that enter through apertures 150 on rear wall 116 toward open areas above outlets 146 on receptacle array 142. In this embodiment, cable deflector 154 is connected to rear wall 116 by hinge 158. Hinge 158 allows for cable deflector to rotate into an up position such that it is positioned at an angle partially in front of apertures 150. Hinge 158 would hold in place cable deflector 154 in this up position. While in the up position, cords or cables could be inserted into apertures 150 from outside the container, where they would hit cable deflector 154 and be pushed upward, away from outlets 146 on receptacle array 142. Alternatively, cable deflector 154 can be rotated down into a stored position such that it does not deflect cables. Cable deflector 154 is useful so that cables inserted into apertures 150 do not inadvertently hit other cables plugged into outlets 146 on receptacle array 142. Cable deflector 154 is depicted as a ramp, but cable deflector 154 may be any configuration that aids in directing outlets above outlets 146.

Referring still to FIGS. 1-5, the reader can see that a locking mechanism 156 is included in cable management container 100. Locking mechanism 156 serves to prevent unwanted access to the interior of cable management container 100. Locking mechanism 156 couples top wall 120 with front wall 114 to restrict access to interior space 122. Locking cable management container 100 may be desirable for homes with small children. Locking mechanism 156 may be a lock or a latch and hook configuration or any configuration that allows user to restrict top wall 120 from opening. The locking feature is especially useful for households with small children because small children often do not appreciate the potential dangers of an electrical outlet. Furthermore, a means for locking the cable organizer container restricts small children from inadvertently disconnecting of the plugs contained within.

Figure 6:
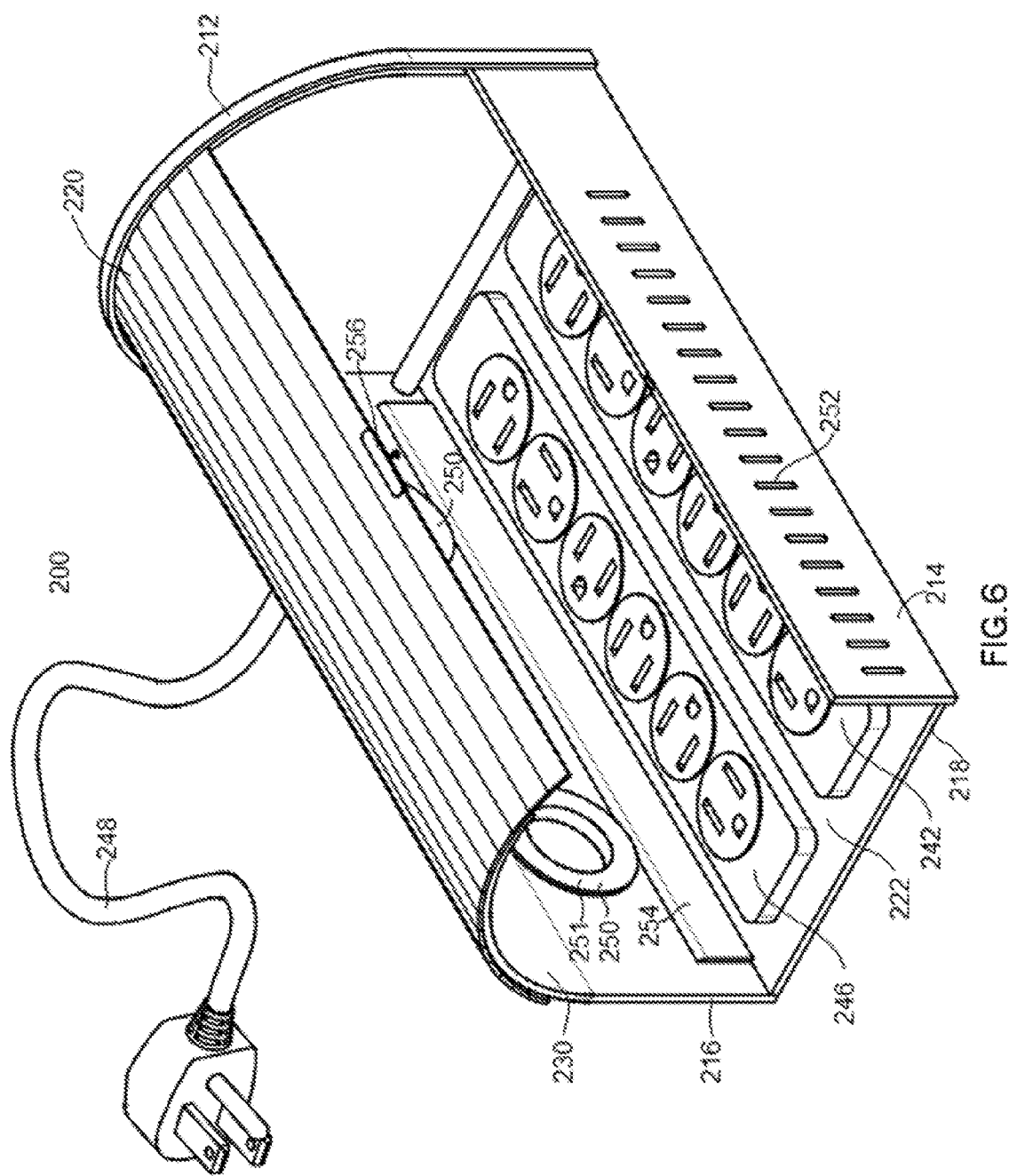
FIG. 6 is a perspective view of another embodiment of the container with a cutaway, showing a top wall as a tambour cover as it is engaged with tracks disposed on side walls.

Referring now to FIG. 6, another embodiment of the invention is shown. Certain aspect of this embodiment of the invention are the same or similar to previously described embodiments of the invention. With reference to FIG. 6, a cable management container 200 is shown and functions to enclose a plurality of power cords that terminate at an internal array of outlets. The top wall of cable management container 200 may be in an open or closed position. Thus, multi-receptacle cable-management container 200 selectively keeps from view the unsightly power cords and allows for the cords to connect to an AC power source the internal outlets.

In operation, cable management container 200 is used to store a plurality of terminated ends of their corresponding power cables. A user may route power cords inside multi-receptacle cable-management container 200 and plug them into the internal outlets. To conceal the power cords, the user may either collect and tie off excess lengths of cord within container 200 or selectively close container 200. However, when a user wishes to view or access the power cords, the user may selectively open container 200.

Cable management container 200 includes a first side wall that is not pictured, but similar to first side wall 110, a second side wall 212, a front wall 214, a rear wall 216, a bottom wall 218, a top wall 220, and a sleeve 230. In the present embodiment, two cable ports 250 are disposed on rear wall 216. Cable ports 250 are lined with perforated rubber grommets 251. The front wall 214 includes a plurality of vents 252. Bottom wall 218 supports at least one receptacle array 242 into which different plugs may be plugged. Receptacle array 242 interconnects outlets 246 with an electrical cord 248 which routes to an exterior wall outlet to deliver electrical power to outlets 246. Cable deflector 254 is permanently or removably attached to rear wall 216. Locking mechanism 256 is included in cable management container 200.

Still referring to FIG. 6, top wall 220 is a tambour cover. In this embodiment, first side wall 210 and second side wall 212 each support tambour tracks on their respective inner surface that follow the bell-arch contour. Opposing longitudinal edges of top wall 220 are disposed into the tambour tracks of each respective side wall. In the case with a tambour cover, the top surface is made up of articulated slats with tambour fitting at each end such that the slats glide through the tambour tracks found on each side wall of the device. Movement of top wall 220 occurs when user slides top wall 220 along each respective tambour track.

Top wall 220 retracts above sleeve 230 when cable management container 200 is in an open position. In use, a user may slide top wall 220 between open and closed positions. Alternatively, top wall 220 is received inside sleeve 230, as described in previous embodiments. Still alternatively, top wall 220 retracts below sleeve 230 when cable management container 200 is in an open position. In the closed position, top wall 220 and sleeve 230 cooperate to cover interior space 222 of cable management system 200.

Figure 7:
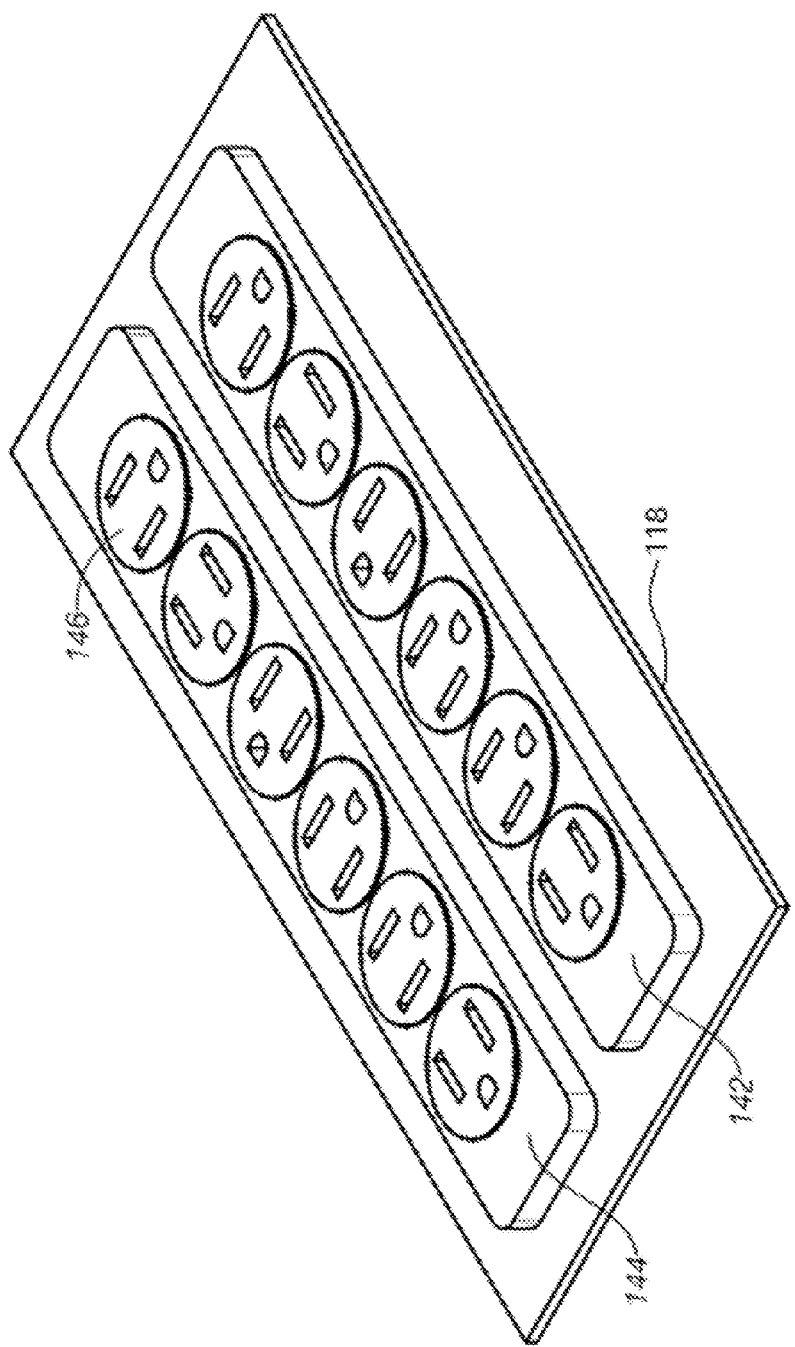
FIG. 7 is a perspective view of a receptacle array of the container.

Referring to FIG. 7, there is shown an example of receptacle array 142. Receptacle array 142 is locate on bottom wall 118, and includes a plurality of outlets 146. FIG. 7 specifically illustrates a 2×6 array configuration which provides a total of twelve individual outlets 146. However, many other array configurations are possible and can contain one or more outlets 146. While the present cable management container is approximately the size of a bread box, other sized cable management containers are also envisioned. Thus, larger-sized cable management containers can accommodate larger numbers of outlets 146, and smaller-sized cable management containers can accommodate smaller numbers of outlets 146.

Individual outlets 146 can rotate up to 360 degrees around a z-axis of outlets 146. In alternative embodiments, the individual outlets 146 are fixedly mounted. In the present embodiment.

Receptacle body 144 functions to provide a physical space between individual outlets 142 and bottom wall 118.

This defined space is used to contain the electrical wiring for each individual outlet 146 within each receptacle array 142.

In alternative embodiments, the individual plugs 146 may be color coded or labeled to assist a user in quickly identifying which electrical appliance is plugged into that particular individual cable port without having to trace the power cord back to the appliance. In addition, the receptacle bodies may be configured with a power-surge electrical circuit that will prevent the flow of AC power to a plugged-in appliance when the electrical circuit detects an overcurrent situation.

Figure 8:
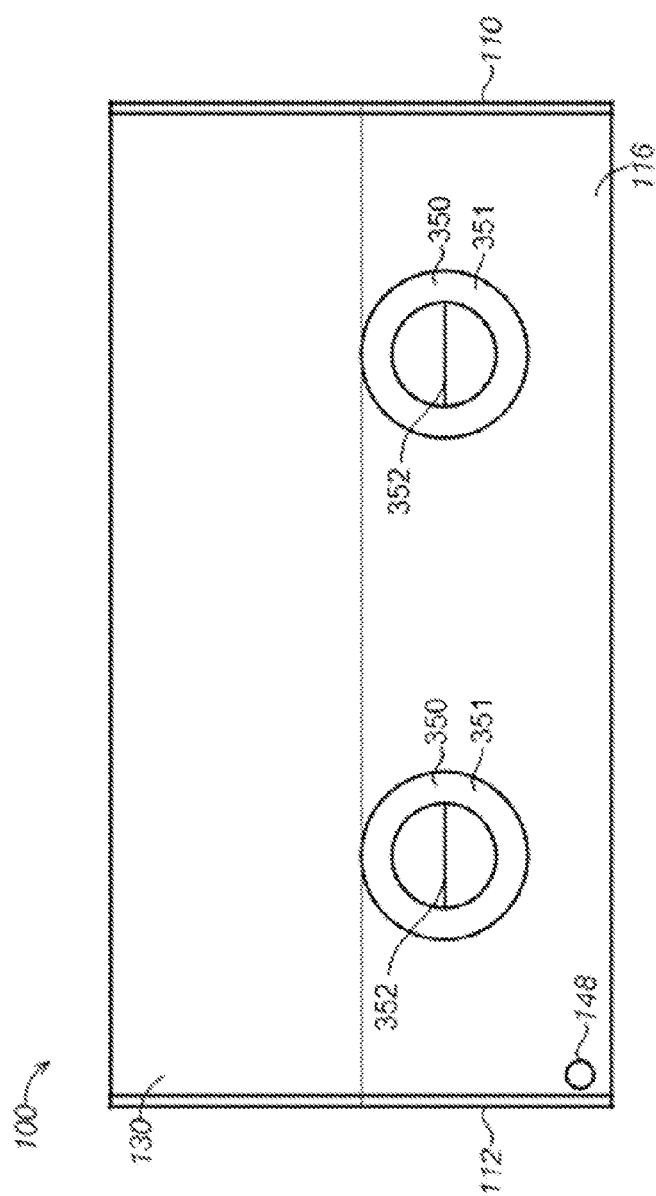
FIG. 8 is a rear view of the cable management container showing a covered aperture.

Referring to FIG. 8, an alternate example of cable ports 150 are described. In this example, cable ports 150 have a covered grommet 351. Covered grommet 351 covers the hole of cable port 150. Cables are inserted into cable ports 150 through a slit 352 in covered grommet 351. In this example, covered grommet has a single slit extending from one side to the other. In alternate examples of covered grommet 351, there are multiple slits providing multiple, flexible cover flaps to cover cable port 150. Covering cable port 150 with covered grommet 351 is aesthetically pleasing because it further covers the inside of cable management container 100, covering the view of cables and cords held within. It covering cable ports 150 with a covered grommet 351 also serves to keep out any unwanted items.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A container for managing and concealing cables and plugs, comprising:
    a first side wall;
    a second side wall spaced from the first side wall;
    a rear wall extending between the first side wall and the second side wall;
    a front wall extending between the first side wall and the second side wall;
    a bottom wall extending between the first side wall, the second side wall, the front wall, and the rear wall;
    a sleeve extending between the first side wall and the second side wall adjacent to the rear wall, said sleeve consisting of a top surface and a bottom surface, wherein said top surface and bottom surface have a space or void between them;
    a top wall extending between the first side wall and the second side wall, defining an inner space of the container, where the top wall selectively opens and closes the container to allow or disallow access to the inner space, wherein said top wall slidingly moves into said sleeve in between the top surface and bottom surface into the space or void, concealing the top wall; and
    a receptacle array adjacent to the bottom wall, the receptacle array comprising at least one power outlet supplied power by an external power cord.

2. The container of claim 1, further comprising;
    at least one aperture located on the rear wall, wherein said aperture is sized to allow a plug and cable to be inserted from outside of the container to the inner space of the container.

3. The container of claim 2, further comprising:
    a protective and cushioning material lining said at least one aperture, wherein said protective and cushioning material is a rubber grommet and is covered by flexible flaps.

4. The container of claim 2, further comprising:
    a cable deflector attached in the inner space adjacent to said aperture, wherein said cable deflector is hinged such that it can be selectively rotated up into a deflector position to deflect plugs and cables away from said receptacle array, or selectively rotated down into a stored position to not deflect plugs and cables away from said receptacle array.

5. The container of claim 1, wherein said top wall is a roll top cover, wherein said roll top cover slidingly moves in tracks located on said first wall and said second wall to selectively transition from an open position that allows access to the inner space to a closed position to disallow access to the inner space, and from a closed position to an open position.

6. The container of claim 1, wherein said top wall is a tambour cover, wherein said roll top cover slidingly moves in tracks located on said first wall and said second wall to selectively transition from an open position that allows access to the inner space to a closed position to disallow access to the inner space, and from a closed position to an open position.

7. The container of claim 1, further comprising:
    a locking mechanism to selectively lock said top wall in a closed position to disallow access to the inner space.

8. The container of claim 1, wherein said at least one power outlet rotates around a z-axis, wherein said z-axis is perpendicular to said at least one power outlet.

* * * * *